United States Patent [19]

England

[11] 4,359,601

[45] Nov. 16, 1982

[54] AUDIO CONTROL SYSTEM

[75] Inventor: Michael D. D. England, Reseda, Calif.

[73] Assignee: David O'Reilly, Newbury Park, Calif.

[21] Appl. No.: 109,939

[22] Filed: Jan. 4, 1980

[51] Int. Cl.³ .............................................. H03J 5/24
[52] U.S. Cl. ................................ 179/1 D; 179/1 MN
[58] Field of Search ............... 179/1 D, 1 AT, 1 MN, 179/1 SP, 1 VL; 333/28 R, 28 T

[56] References Cited

U.S. PATENT DOCUMENTS

| | | | |
|---|---|---|---|
| 3,750,044 | 7/1973 | Stanley | 179/1 D X |
| 3,803,359 | 4/1974 | Corderman | 179/1 D |
| 4,118,601 | 10/1978 | Yeap | 179/1 D |

OTHER PUBLICATIONS

L. Robinson, "Graphic Level Display", Practical Electronics, vol. 13, No. 1, p. 57, Jan. 1977.

Primary Examiner—Joseph A. Popek
Attorney, Agent, or Firm—David O'Reilly

[57] ABSTRACT

An audio control system comprised of an equalizer which divides and controls the level of a plurality of audio frequency bands and an electronic display which provides an illuminated indication of equalizer settings and output levels in each of the audio frequency bands. The audio control system can receive stereophonic input from one of several sources and provide an output to front and rear pairs of amplifiers. The electronic display is comprised of a plurality of light-emitting diodes arranged in columns which provide either a static display of equalizer settings or a calibrated display indicating the output levels in each audio frequency band of the equalizer.

25 Claims, 10 Drawing Figures

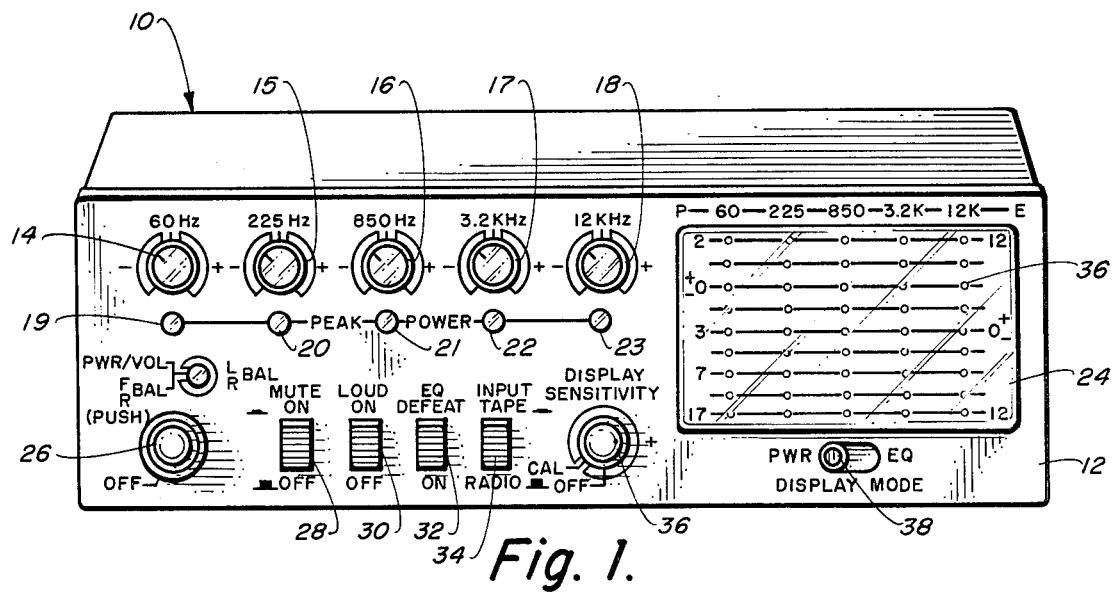
Fig. 1.
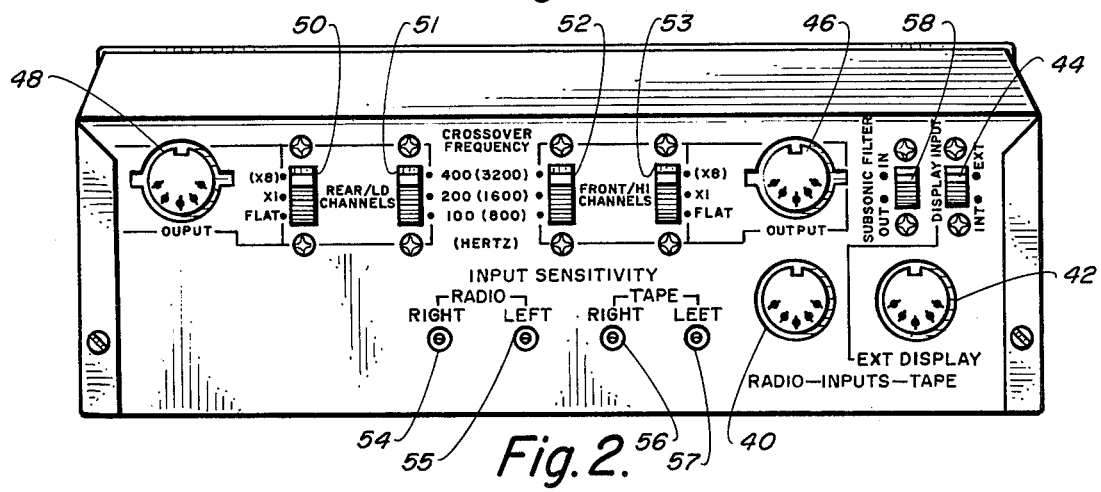
Fig. 2.
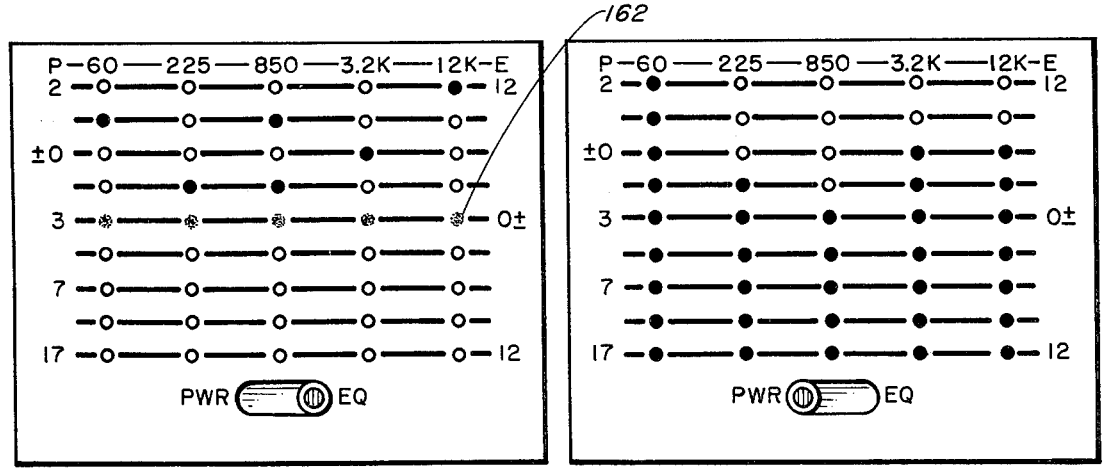
Fig. 7.     Fig. 8.

AUDIO CONTROL SYSTEM

BACKGROUND OF THE INVENTION

This invention relates to audio control systems and more particularly relates to an audio control system in which an equalizer is coupled to an illuminated electronic display.

The basic function of an equalizer in an audio system is to correct for tonal abnormalities in what is ultimately heard by the listener. A number of factors are capable of imposing colorations on the sound and it is generally accepted that graphic equalizers provide the most flexible means to correct such colorations.

These graphic equalizers split the audio spectrum into a plurality of smaller segments or frequency bands and provide means to control the level of each band. The adjustments are usually in the form of slide controls, the sliders providing a visual representation of the frequency response of the equalizer.

One disadvantage of the conventional approach is that an equalizer with slide controls is generally bulky and tends to become a very large electronic instrument when there are more than a few controls. Further, the equalizers are difficult for the average person to use because there are more controls to be adjusted and a considerable amount of practice and experimentation is required to properly equalize an audio system. This is generally because the listener cannot mentally link what he is hearing with the visual representation provided by the position of the slide control for each frequency band. It is an object of the present invention to overcome these disadvantages.

SUMMARY OF THE INVENTION

The purpose of the present invention is to provide an audio control system in which an equalizer provides adjustment for a plurality of various frequency bands, coupled to an electronic display which provides a visual representation of the output level of each band.

The audio control system of the present invention overcomes the disadvantages of the prior art devices by providing the user with additional visual information to assist in the use of an equalizer. The control system includes a multi-band equalizer and in addition a multi-purpose electronic display. Part of the display resembles a graph similar to the face of an oscilloscope with a horizontal axis representing frequency and the vertical axis representing amplitude. In one mode of operation (equalizer-display) the settings of the equalizer controls are presented on the display along with a zero base line indicating a "flat" response. The result is an illuminated graphic representation of the overall frequency response of the equalizer.

It should be noted that this equalizer-display combination is analogous to the mechanical display provided by conventional slide controls, but without the use of such slide controls. This display mode allows the equalizer to be controlled by practically any means, and yet the electronic display device provides a much more intelligible graph of the response than would be obtained with the use of slide controls.

In the preferred embodiment rotary controls are provided for adjusting the equalizer which permits the electronic control system to be considerably reduced in size. Thus, the audio control system finds particular application in automobile stereophonic systems where space is at a premium.

In another mode of operation the electronic display of the audio control system becomes a dynamic real-time spectrum analyzer. A spectrum analyzer splits the audio frequency spectrum into smaller segments in a manner similar to that of the equalizer and then indicates the audio level in each of the segments. The "real-time" designation means that each of the segment levels ae displayed dynamically and continuously and are independent of each other. In the audio control system of the invention each spectrum analyzer segment corresponds to an equalizer segment making it possible to see the exact level in each segment of the audio frequency spectrum at any instant and to also control the level of that segment.

The user can now see as well as hear exactly what happens when an equalizer is adjusted. Thus, he has a dynamic continuously changing display with which he may mentally link the changing audio levels he is hearing, allowing nearly instant recognition of where corrections may be required. Furthermore, the considerable amount of experimentation and experience required to operate previous equalizer systems is not necessary.

The electronic display inputs are normally connected to the equalizer outputs and are thus displaying the audio signal that is being sent to the power amplifiers. A calibrated setting is provided for the electronic display sensitivity so that it is possible to know at what point power amplifiers (or speakers) will overload. A separate overload indicator (i.e. peak indicator) is provided for each audio frequency segment to visually emphasize when this overload condition occurs. Thus, when the sensitivity of the electronic display is calibrated, the segments of the audio spectrum causing the overload are indicated, allowing the user to compensate by lowering the appropriate equalizer control.

An additional function of the audio control system may be provided by a plug allowing an external input to the electronic display. Since the electronic display of the audio control system contains all of the required equipment for using it as a spectrum analyzer, the external input is provided for use with various components. This allows the general public to utilize the system in a manner similar to that of professional audio enthusiasts who may utilize a spectrum analyzer in conjunction with a calibrated microphone and a special signal generating source to properly equalize an audio system. With the electronic display of the present invention, one can adapt it for such use to indicate that the overall frequency response is correct, by connecting the calibrated microphone and the signal generating source to the external input provided for this purpose.

The present invention utilizes special and unique circuits designed to allow its use within an automobile stereo system, although the circuits may prove useful in other applications. In particular, an inverter power supply is included to make a large signal output possible, and to eliminate coupling capacitors for improved low-frequency response. The usual problems of mechanical or radio-frequency noise have been overcome through careful inverter design. A sub-sonic filter is (optionally) included in the signal path to eliminate speaker-damaging "thumps" often encountered in car stereo equipment, particularly FM flutter and turn-on transients.

The electronic display circuits employ an active rectifier with dual-diode coupling to provide an "OR"ed signal which selects for display the predominant channel (left or right) within each frequency band. In addition, a special and unique visual function is provided by the circuitry that generates the dimmed zero base line for the equalizer-display mode.

It is one object of the invention to provide an audio control system having an equalizer coupled to an electronic display.

Another object of the present invention is to provide an audio control system having an equalizer and an electronic display which indicates frequency response of the equalizer.

Still another object of the present invention is to provide an audio control system having an electronic display which indicates real-time spectrum analysis of an equalizer.

Another object of the present invention is to provide an audio control system having an equalizer and a dual-mode electronic display.

Still another object of the present invention is to provide an audio control system having an equalizer and electronic display which provides means for selecting one of several inputs.

Yet another object of the present invention is to provide an audio control system having an electronic display and means for applying an external input to said electronic display.

Still another object of the present invention is to provide an audio control system having an electronic display which displays the predominant stereophonic signal.

Still another object of the present invention is to provide an audio control system having an inverter-type power supply in which the rise time of the switching waveform is limited purposefully by the slew rate of an integrated-circuit operational amplifier.

Still another object of the present invention is to have an audio control system having an equalizer and electronic display which includes means for defeating the equalizing function.

Yet another object of the present invention is to provide an audio control system having audio processing circuits which provide means for instantly muting the output.

Yet another object of the present invention is to provide an audio control system, including means for attenuating low-frequency transients.

These and other objects and advantages and novel features of the invention will become apparent from the following detailed description of the invention when considered in conjunction with the accompanying drawings, wherein like reference numbers identify like parts throughout.

BRIEF DESCRIPTION OF THE DRAWINGS

FIG. 1 is a front elevation of the audio control system of the present invention illustrating the various controls and electronic display.

FIG. 2 is a rear view of the audio control system showing connectors for various inputs and adjustment of various circuits.

FIG. 7 illustrates the electronic display in the equalizer-display mode.

FIG. 8 illustrates the electronic display in the power or spectrum-analysis mode.

DETAILED DESCRIPTION OF THE PREFERRED EMBODIMENT

Figure 3:
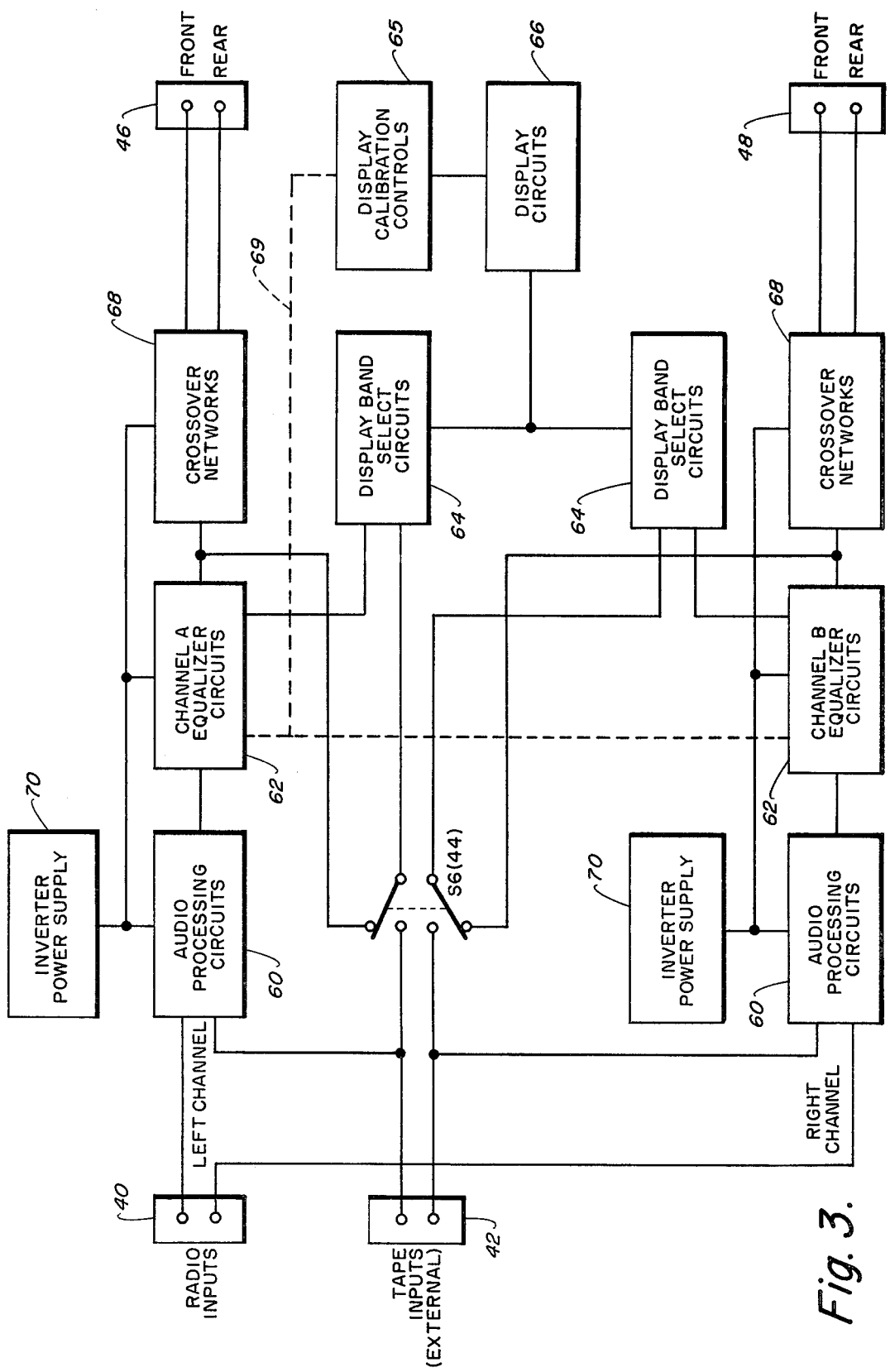
FIG. 3 is a simplified block diagram of the audio control system showing both channels.

Referring to FIG. 1 there is shown an audio control system generally indicated at 10, having a front bezel 12 on which are a number of controls. The audio control system is primarily intended for use in high-quality automobile audio systems but the circuits and principles of the invention may be applied for any audio system. The audio control system employs a five-band equalizer with controls 14 through 18, provided for controlling each of the bands indicated. For purposes of compactness, because space is at a premium in automobiles, each of the controls is a ganged rotary equalizer control which simultaneously controls the display 24 in one mode. An on-off switch 26 is provided which simultaneously operates a concentric control to adjust volume, left-right balance, and front-rear balance. Switches 28, 30, 32 and 34 provide controls for muting, loudness, equalizer defeat and tape/radio select, respectively, and their function will be described in greater detail hereinafter. Switch 36 is an on-off switch which also provides a rotary control for adjusting the sensitivity of the display 24. The display 24 is provided by columns of light-emitting diodes 36. Each column of the light-emitting diodes in the display 24 corresponds to one of the bands in the equalizer represented by one of the respective controls 14 through 18. The display 24 provides an indication of the output level of each band of the equalizer with a single LED 19 through 22 indicating an overload condition for the corresponding equalizer channel.

As was indicated, the electronic display 24 is comprised of a main display panel which consists of five vertical columns of nine light-emitting diodes 36 each located behind a screen. The switch 38 directly below the display selects the desired mode for the display. A real-time, dynamic, continuously changing display is provided when the switch 38 is in the "power" mode and a static display of the adjustment of each band of the equalizer is provided when the switch 38 is in the equalizer position. The selection of the modes and operation of the various controls will be described in greater detail hereinafter.

In FIG. 2, additional controls and inputs are shown on the back panel. The input connectors 40 and 42 are for connection of radio and tape inputs respectively, with switch 44 allowing selection of an external display input into connector 42. Output connections to power amplifiers are provided at 46 and 48. Selection of the cross-over frequency of the various amplifier-speaker systems connected to the outputs 46 and 48 are provided by switches 50 through 53. With these switches, selection of high-pass and low-pass outputs in front and rear outputs, respectively, may be made. Screw driver adjustments 54 through 57 are provided on the rear panel for compensating for differences in the input levels from tapes or radio. Lastly, switch 58 is provided on the back panel for switching a sub-sonic filter in or out of the circuit to prevent "thumps".

The circuitry of the audio control system may be divided into three main groups, illustrated in block diagram form in FIG. 3—the audio processing circuits, the equalizer circuits and the display circuits. The circuits in FIG. 3 also illustrate dualchannel processing with the circuits for channel A and channel B being identical. Thus, the audio processing circuits 60 in both channels are identical as are the equalizer circuits 62 and the display band select circuits 64 which provide an input to the display circuits 66. The outputs of the equalizer circuit 62 are processed through cross-over networks 68 and are delivered to output connectors 46 and 48. Power for operation of the amplifiers utilized in the circuits of the audio control system is supplied by novel inverter power supply 70.

The radio output is connected to the jack 40 with the tape output connected to the jack 42. For an external display input, the external connection is made to jack 42 with switch S6 switched to apply the input directly to the display band select circuit 64, thus bypassing the audio processing circuits and equalizing circuits. With this switching function, the electronic display may be utilized as a professional spectrum analyzer with external equipment connected (not shown).

Figure 4:
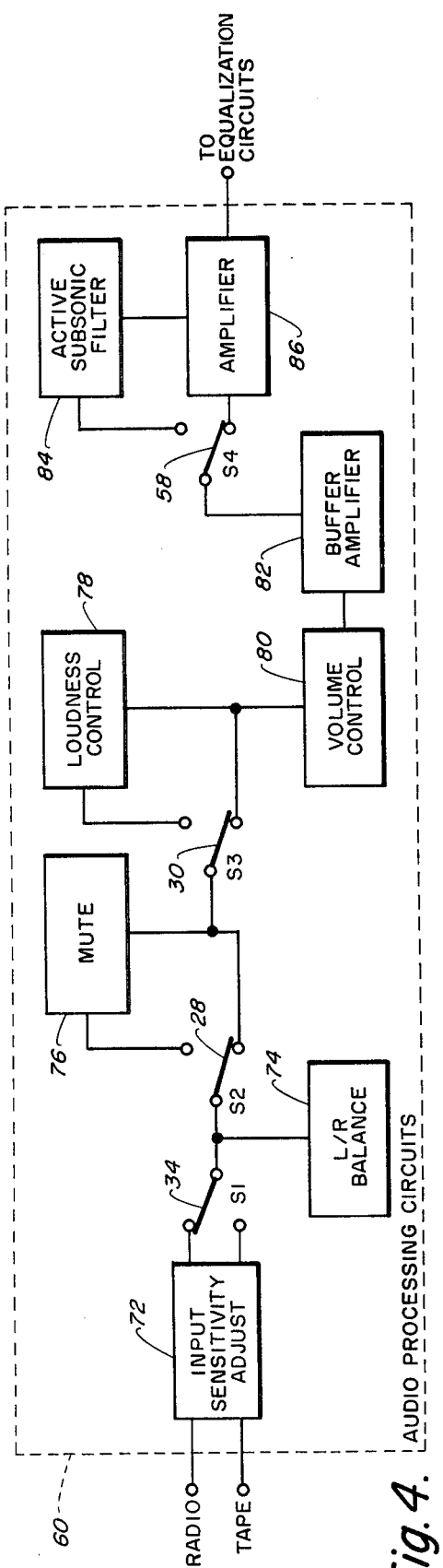
FIG. 4 is a block diagram of the audio processing circuits of one channel of the audio control system.

The block diagram of FIG. 3 illustrates both channels of the audio control system, while in FIG. 4 the block diagram illustrates only the audio processing circuit for one channel as both are identical. The audio processing circuit 60 is comprised of an input sensitivity adjustment (i.e. screw driver adjustment potentiometers 54 through 57 shown on the back panel) connected through an input selector switch S1 which selects one of two available inputs (either radio or tape) and directs it to the main signal path where it first passes through a network consisting of a left-right balance control 74 which is one-half rotary control 26. An audio muting circuit 76 switched in or out by switch 28 selectively introduces a 20 db loss in the signal path. This provides a temporary lowering of the volume allowing the volume control 26 to remain at a preset level. A loudness switch 30 is provided in the main signal path to enable loudness function circuit 78 to provide a boost to the high and low ends of the audio spectrum when the volume control 80 is set at low levels.

After passing through the loudness network 78, the signal goes through the volume control 80 and a buffer amplifier stage 82 which restores losses in the audio processing circuit and buffers the signal. The output of the buffer amplifier is connected through switch S4 which enables the active sub-sonic filter components 84. Thus, the output of buffer amplifier 82 drives the input of the amplifier 86 and select switch 58 configures amplifier 86 as either a buffer or an active filter. The active sub-sonic filter components 84, in conjunction with amplifier 86, form a sharp-cutoff, active, high-pass filter which, when not disabled by rear panel switch 58, introduces an 18 dB per octave roll-off of frequencies below 40 hertz. With the sub-sonic filter defeated by switch 54, the response of this stage is flat.

At this point the signal passing through the audio control system may follow one of two paths depending upon the setting of the equalizer defeat switch 32 (S5). If the switch is in the defeat position, the signal passes straight through to the succeeding stages, bypassing the equalizer circuit. If the switch is in the equalizer enable position, the signal will first pass through the equalizer and then proceed to the following stages.

Figure 5:
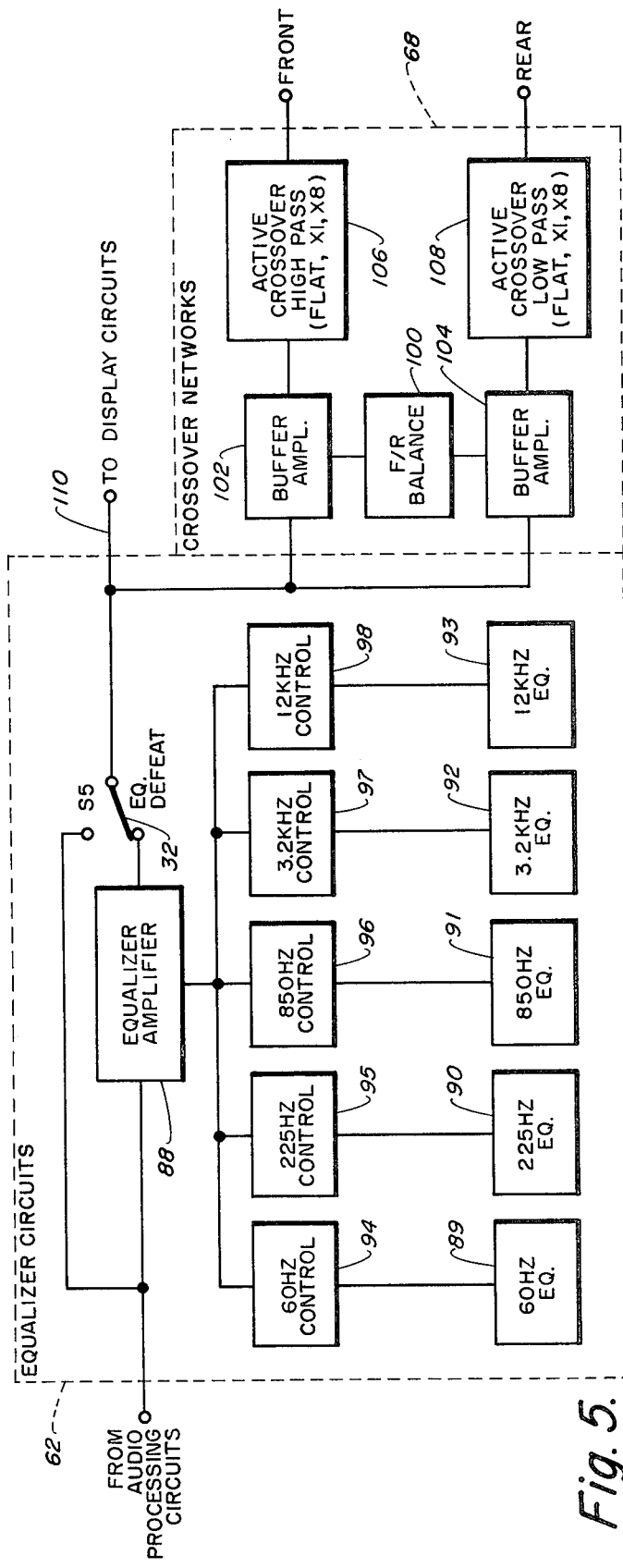
FIG. 5 is a block diagram of the equalizer and cross-over circuits of one channel of the audio control system.

The equalizer circuits are illustrated in FIG. 5 and are comprised of a unity gain differential amplifier stage 88 with equalizer controls 94 through 98 connected between inverting and non-inverting inputs of the equalizer stage 88. The equalizer controls 94 through 98 are potentiometers mechanically ganged with the potentiometer controls for the stages in the other channel through front panel controls respectively numbered 14 through 18. Each of these controls covers approximately two octaves with center frequencies preferably selected at 60 Hz, 225 Hz, 850 Hz, 3200 Hz and 12,000 Hz for automotive applications. In addition, these controls are mechanically ganged to the potentiometer controls 65 connected to the display circuit 66 as indicated by the dotted line in FIG. 3 at 69. The purpose of this mechanical ganged coupling will be described in greater detail hereinafter.

The wipers of the equalizer potentiometer controls 94 through 98 are connected through series resonant circuits 89 through 93 to ground and thus for a given setting of a control the resonant circuit will either shunt the input to equalizer stage 88 to cut the signal, or it will shunt the feedback to boost the signal. The equalizer circuit itself is somewhat conventional in design and operates on the same general principle of prior art audio frequency graphic equalizers.

The output of the equalizer is fed to the display circuits and is also split into two other parts (front and rear channels) going to the front-rear balance controls 100 which are also a part of the front panel control 26. The split output from the equalizer is connected to buffer amplifiers 102 and 104 and then to active cross-over networks 106 and 108. Thus, as shown in FIG. 3, there are four outputs from the unit, two front and two rear. Cross-over select switches 50 through 53 allow selection of the −3 dB frequency of active cross-over circuits 106 and 108 so that they may be set flat, such that the corresponding output is flat, or the cross-over may be set to one of several possible frequencies such that the two front channels are the high-pass side and the two rear channels are the low-pass side. The outputs from connectors 46 and 48 may now be connected through two power amplifiers forming what is termed a "bi-amp setup" with one amplifier driving low-frequency speakers, or woofers, and the other driving mid/high-range speakers, or tweeters. The cross-over select switches 50 through 53 operate in conjunction with the active cross-over networks 106 and 108 to "flat", or one of six cross-over frequencies for each output jack 46 and 48.

Figure 6:
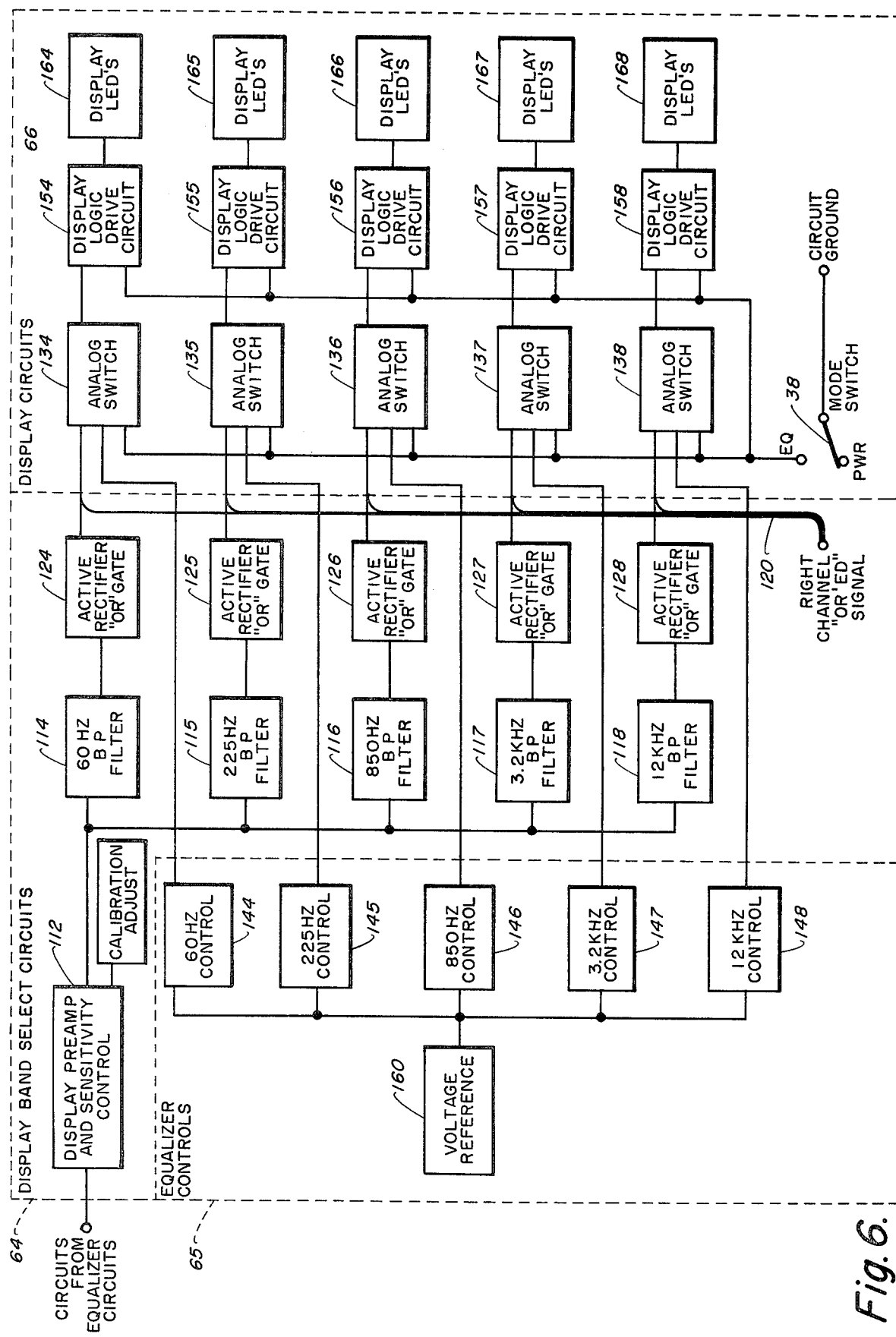
FIG. 6 is a block diagram of the display circuits of the audio control system.

The electronic display circuit inputs may be selected by switch 44 (S6) which may be either from an external or internal source. As shown in FIG. 6, the signal first passes through a display preamp 112 having a potentiometer sensitivity control. The sensitivity control (36 on front panel) also turns the display on or off. The preamplifier stage 112 brings the signal from the equalizer circuit (or external source) up to a useful level. The output of display preamp 112 is distributed to the inputs of five active band pass filters 114 through 118 whose center frequencies correspond to those of the equalizer controls 94 through 98. The filters 114 through 118 thus will pass only those frequencies of interest and reject all others. The outputs of the filters 114 through 118 are connected to active rectifier circuits 124 through 128 respectively, which convert the peak AC voltage into a DC voltage. The rectifier circuits 124 are able to respond to very short duration peaks in the program material and cause the ultimate display to be "peak responding". The above description is of one stereo channel, and applies equally to the remaining channel.

At this point there are five outputs from the left channel and five outputs from the right channel indicated at 120. Each of the five pairs of outputs are then fed through an analog "OR" gate, meaning that either the left or the right channel signal will predominate, depending upon which is higher in level. The resulting display is more meaningful in terms of amplifier power and overload indication than it would be if left or right channel signals were simply summed together. The analog OR gates are provided by a dual-diode connection of each active rectifier in both left or right channels, which are then coupled together. This allows the predominant channel to be displayed while the subordinate channel is suppressedd, thus providing an analog OR function.

After being ORed together, the five sets of DC voltages pass through respective analog switches 134 through 138. When display mode select switch 38 is in the power (i.e. spectrum analyzer) mode, the analog switches pass the DC voltages from the active rectifiers 124 through 128 of the predominant channel output. With the switch 38 in the equalizer mode, they select a DC voltage derived from the potentiometers 144 through 148 which are mechanically ganged to the equalizer controls 94 through 98. The voltages from the analog switches 134 through 138 are fed to the inputs of display logic drive circuits 154 through 158 which include special integrated circuits to perform the required analog-to-digital conversion.

Internally, the display logic drive circuits 154 through 158 are comprised of an integrated circuit which buffers the input signal and applies it to a series of ten comparators. Each of the comparators is referenced to a different point on a precision voltage divider network, which in turn is tied to a precision voltage reference source 160. As the input signal increases, more of the comparators will be turned on. The output of the comparators control internal current sources, which directly drive external LEDs (light-emitting diodes) 164 through 168. The display LEDs 164 through 168 represent one column of the display 24, including the peak indicators 19 through 23 of the respective columns of LEDs. The display logic drive circuits 154 through 158 are comprised of integrated circuits which also contain internal logic to generate a bar-graph mode or a single-dot mode as directed by mode select switch 38. The display logic drive circuit is preferably an integrated circuit such as a National Semi-conductor integrated circuit LM 3914, appropriately connected to display circuits to provide a bar-graph mode or single-dot mode.

Power for the display LEDs 164 through 168 is obtained from a minus-five volt voltage regulator in order to minimize power dissipation in the analog-to-digital integrated circuits of the display logic drive circuits 154 through 158. This voltage regulator also provides a bias source for the operational amplifiers used in the spectrum analyzer circuitry. In the preferred embodiment, the display circuits operate from a single-ended supply, namely an automobile twelve-volt electrical system. The power supply and operation of the display logic drive circuit will be described in greater detail hereinafter.

The operation of the system is illustrated in the graphical diagrams of FIGS. 7 and 8. In FIG. 7 the audio control system is illustrated with the display mode switch in the equalizer position, providing a single-dot mode. In this mode only a single LED is illuminated in each column respresenting the five audio frequency bands. The position of these respective illuminated lamps is adjusted by the controls 14 through 18 which effectively adjust the ganged potentiometers 144 through 148, applying a reference voltage from the voltage reference source 160 to the analog switches 134 through 138. Since the audio frequency band controls 144 through 148 are mechanically ganged to the equalizer controls 94 through 98, the position of the illuminated LED thus represents the precise setting of the individual equalizer control for that band. A unique feature in the equalizer mode is the inclusion of a dimmed display 162 providing a zero base line indication. Thus, the black dots illustrate the position of a particular setting of the display and equalizer control to indicate whether a particular audio frequency band has been boosted or cut. In the display illustrated, all audio frequency bands are illustrated with some boost with a slight boost in the mid-band and a higher level in the upper and lower bands. The dimmed LEDs at 162 provide a zero base level as a quick reference point to indicate whether or not a boost or cut has been applied. If the equalization defeat switch 32 is switched to the defeat position, the display will be flat or correspond to a bright display along the zero base line 162, illustrated in FIG. 7.

With the display mode switch 38 in the power mode, the display would be continuously changing in a manner similar to that illustrated in FIG. 8. The black dots illustrate various levels in the five audio frequency bands at a particular instant in time. This display will be constantly changing, illustrating the changing levels of the audio signal in each one of the frequency bands. For example, in the 60 Hz band the output at the instant illustrated is at the highest level and may be illuminating the peak detector 19 adjacent to the 60 Hz control 14. This may indicate a need to reduce the level in that particular frequency band by adjustment of control 14.

The display sensitivity is adjusted by means of control 36 which will adjust the display sensitivity in the power mode. If the volume control 26, however, is set at a low listening level, the output of the display 24 may not be very visible. In order to provide a more visible display, the display sensitivity can be increased to a more visible level by adjusting sensitivity control 36. Thus, the display would still give an indication of the relative output of one band with respect to the next, even at low levels.

The control 26 is a multiple concentric control which allows individual quad speaker control because it provides adjustment of left-right balance or front-rear balance separately. That is, an outer concentric control allows left-to-right balance, while the center control allows front-to-rear balance separated by pushing in control 26. Front-rear balance can be accomplished and is fixed (i.e. memorized) by releasing the knob. Thus, by rotation of control 26, volume may be increased or decreased without affecting the front-rear balance adjustment. Conversely, front-rear balance may be adjusted by pushing in on knob 26 and adjusting the front-rear balance without affecting the "memorized" volume control position.

The controls 14 through 18 also provide a unique feature of knob inserts which may be differently colored to distinguish different frequency bands. These knob inserts have pointers and may be easily removed, and the pointer repositioned to serve as a "memory" setting for the favored equalizer adjustment position of each control. Thus, once the control settings for a particular user in a particular environment have been determined, the knob inserts may be removed and all positioned to point in the same direction, serving as a memory for that favored setting.

Figure 9:
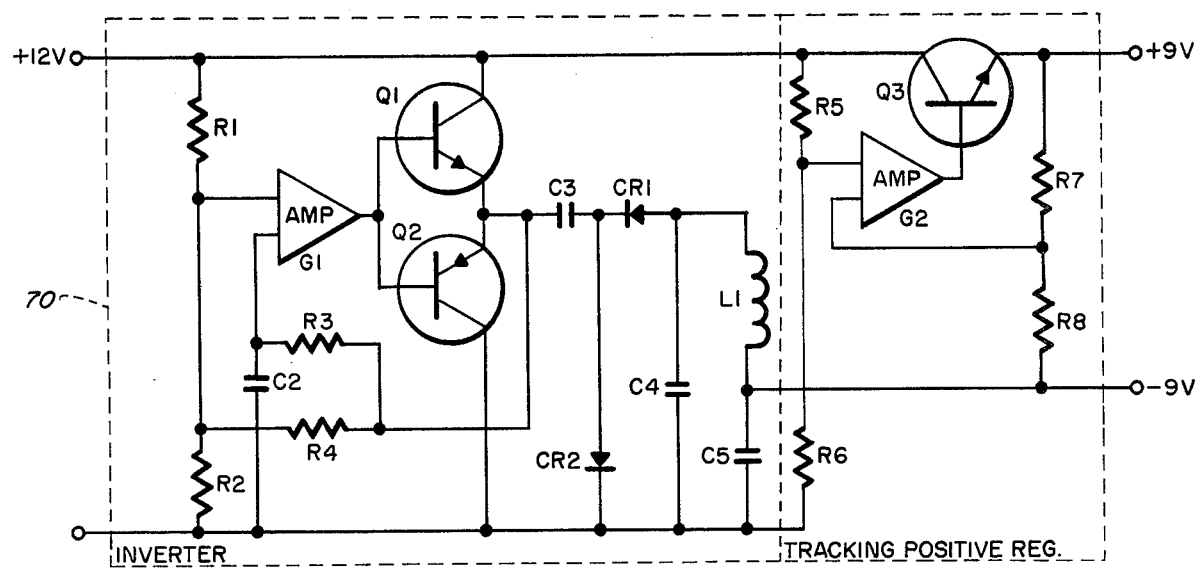
FIG. 9 is a schematic diagram of the inverter power supply of the present invention.

In addition to the features described above, the audio control system provides a unique inverter and tracking positive regulator power supply, particularly designed for use with low-voltage power sources, such as a 12-volt automobile electrical system. All of the active elements in the main signal path (i.e. audio processor and equalizer circuits) utilize "BI-FET" (National Semi-conductor TM) such as a National Semi-conductor LF353, operational amplifiers. These operational amplifiers provide extremely high input impedance, good matching, low noise and extremely wide band width, even for large output signals (high "slew rate"). However, the 12-volt supply available from an automobile electrical system is not sufficient to directly power the operational amplifiers and still obtain an adequate output level in this application. Therefore, the inverter power supply of FIG. 9 was designed to provide adequate power supply voltages. The inverter circuit shown in FIG. 9 is comprised of an oscillator G1 coupled to a voltage doubler comprised of transistors Q1 and Q2 which double downward but with some losses. Therefore, the output is approximately −9 volts. The parameters of oscillator G1 are selected such that the rise time of the generated square wave is limited by the slew rate of the integrated circuit operational amplifier to prevent radiation of switching transients which would interfere with the performance of an AM or CB radio. The slew rate of an integrated circuit operational amplifier is controlled during its manufacture, and is therefore quite predictable and repeatable from unit to unit. Hence, the performance of the inverter is also predictable and repeatable. The circuit comprised of resistors R1, R2, R3 and R4 and capacitor C2 sets the frequency of the oscillator G1. The output of the voltage doubler is tracked by the tracking positive regulator, providing an 18-volt power supply varying between +9 volts and −9 volts.

An advantage of this inverting power supply is that it is an equal plus and minus (i.e. bipolar) and allows biasing of operational amplifiers in the equalizer and audio processing circuits at ground level. This eliminates the need for coupling capacitors throughout the audio processing, equalizing, and cross-over circuits providing greatly improved low-frequency response. Thus, all stages are direct coupled and the frequency response of the audio signal path can extend from DC to well over 300 KHz.

Figure 10:
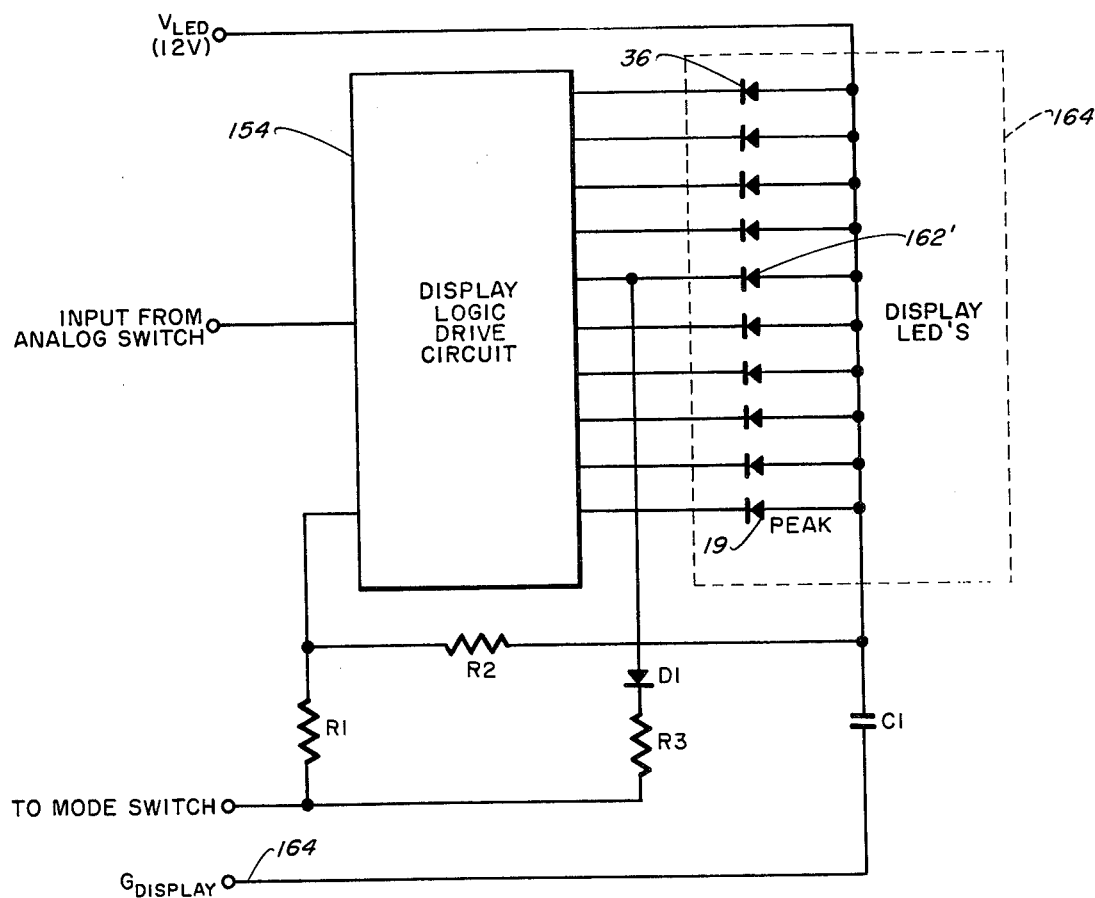
FIG. 10 is a schematic diagram of one of the display circuits of the audio control system.

As was discussed previously, the display logic drive circuits are special integrated circuits which provide the required analog-to-digital conversion and may be National Semi-conductor ICs indicated above. These ICs are connected in a unique fashion to provide low power dissipation and provide a zero base line 162 illustrated in FIG. 7. The connection of the IC circuit is illustrated in FIG. 10. The light-emitting diodes 36 are connected to the display logic circuit driver 154 and to a 12-volt input.

In order to provide the zero base line shown in FIG. 7, the center diode 162' is connected through a diode D1 and resistor R3 to mode switch 38. With the mode switch in the equalizer position, the center diode 162' is connected to circuit ground and is thus continuously iluminated at a low level. Each of the display circuits are connected in this way and provide a zero base line 162. Thus each display circuit is uniquely connected to provide a zero base line in one mode and are connected to provide minimum heat dissipation to prolong life of the light-emitting diodes.

Additionally, the display circuit ground is actually "floating" and is connected to an active regulator circuit having a heat sink remote from the actual display panel. This prevents excessive heat buildup in the display area, which is of particular importance in a compact circuit to be utilized in an automobile where spaces are confined and at a premium. As a result of this connection, the display "ground" is actually maintained at a level five volts below the main +12-volt power supply. The positive supply for the display drivers is obtained through two silicon diodes in series, and therefore local dissipation is minimized, since the LEDs and drivers operate from a 3.8-volt supply.

Thus there has been disclosed a novel and unique audio control system in which the equalizing circuit is provided with an electronic display which provides a useful, visual indication of the level of each audio frequency band of the equalizer circuits. A multiplicity of controls are provided to vary the display as well as vary the display inputs. Additionally, unique output circuits are provided to provide independent quad-speaker controls both in balancing, level and cross-over frequency selection.

Obviously, many modifications and variations of the present invention are possible in light of the above teachings. It is therefore to be understood that the full scope of the invention is not limited to the details disclosed herein and may be practiced otherwise than as specifically described.

What is claimed is:

1. An audio control system comprising:
means for connecting a stereophonic input signal;
audio processing means for processing said stereophonic signal;
dividing means for dividing the stereophonic signal from said processing means into a plurality of audio frequency bands;
level adjusting means for adjusting the level of each of said plurality of audio frequency bands; and
electronic display means coupled to said level adjusting means for electronically displaying the relative adjusted level in each of said plurality of bands;
said electronic display means including means for dynamically displaying the output of each of said plurality of audio frequency bands comprising:
a pre-amplifier receiving the output of said audio processor;
a band pass filter receiving the output of said pre-amplifier;
an active rectifier for rectifying the output of the band pass filter;
light column means;
means connecting the output of said active rectifier to said light column means whereby the light column means varies according to the level of each audio frequency band.

2. The audio control system according to claim 1 wherein said means for connecting a stereophonic input signal comprises:
means for selecting one of several inputs.

3. The audio control system according to claim 1 wherein said dividing means comprises means for dividing an audio frequency spectrum into five bands, each of said bands covering approximately two octaves.

4. The audio control system according to claim 1 wherein said electronic display comprises:
a plurality of light-emitting diodes arranged in columns, the number of columns equalling the number of audio frequency bands from said dividing means.

5. The audio control system according to claim 4 wherein said display means includes:
means for selectively combining both channels of said stereophonic signal so that a predominant signal is displayed.

6. The audio control system according to claim 5 wherein said means for selectively combining said stereophonic signal comprises:
an active rectifier or gate for rectifying each of said plurality of audio frequency bands;
logic means coupling the active rectifier of one channel with the active rectifier of the other channel for the respective audio frequency bands whereby the signals are ORed together.

7. The audio control system according to claim 1 wherein said means for connecting the output of said active rectifier to the light column means comprises:
analog switching means; and
drive means for driving said light column means.

8. The audio control system according to claim 1 wherein said dynamic display means includes:
sensitivity control means adapted to adjust the output of said pre-amplifier means.

9. The audio control system according to claim 8 wherein said sensitivity control means includes an on-off switch whereby the electronic display may be selectively switched on or off.

10. The audio control system according to claim 1 including means for selectively displaying the adjusted level of each of said audio frequency bands on said electronic display means.

11. The audio control system according to claim 10 wherein said means for displaying the adjusted level comprises:
switching means for switching the display to a dot mode;
reference voltage means;
adjustable means for adjustably applying said reference voltage to said display;
means for linking said adjustable means to said level adjusting means whereby said display is indicative of the position of said level adjusting means.

12. The audio control system according to claim 11 wherein said adjustable means and level adjusting means are potentiometers mechanically ganged together for simultaneous adjustment.

13. The audio control system according to claim 11 including means for illuminating a zero base line on said display means when said display means is in said dot mode.

14. The audio control system according to claim 13 wherein said display means comprises:
a plurality of columns of light means;
each of said columns including an odd number of lights;
said means for illuminating a zero base line includes means for dimly illuminating the center light of each column.

15. The audio control system according to claim 14 including minimizing heat dissipation in said display means by connecting said display to a floating ground whereby the power dissipation across each light means and its drive means is a minimum.

16. The audio control system according to claim 1 including a power supply means comprising an inverter power supply means.

17. The audio control system according to claim 16 wherein said inverter power supply means is adapted to allow a bias at ground potential to amplifying circuits in said audio processing means and dividing means.

18. The audio control system according to claim 17 wherein said inverter power supply comprises:
an oscillator;
means for controlling the rise time of said oscillator whereby radiation of switching transients is prevented.

19. The audio control system according to claim 18 wherein:
said oscillator is a square wave generator; and
said means for controlling the rise time includes means for converting the square wave substantially to a triangular wave.

20. The audio control system according to claim 19 wherein said means for converting the square wave substantially to a triangular wave includes means for utilizing the slew rate parameter of an integrated circuit operational amplifier for achieving such conversion.

21. The audio control system according to claim 1 wherein said audio processing means includes means for instantly attenuating said stereophonic signal.

22. The audio control system according to claim 21 wherein said means for instantly attenuating the stereophonic signal comprises:
an attenuating circuit; and
switch means for switching said attenuating circuit in or out of the path of said signal.

23. The audio control system according to claim 1 including means for attenuating low-frequency transients in said audio processing means.

24. The audio control system according to claim 23 wherein said low frequency attenuating means comprises a sub-sonic filter means.

25. The audio control system according to claim 24 including means for switching said sub-sonic filter in or out of the path of said stereophonic signal.

* * * * *